United States Patent [19]

Tseng et al.

[11] Patent Number: 5,534,460
[45] Date of Patent: Jul. 9, 1996

[54] OPTIMIZED CONTACT PLUG PROCESS

[75] Inventors: Horng-Huei Tseng; Chih-Yuan Lu, both of Hsin Chu, Taiwan

[73] Assignee: Vanguard International Semiconductor Corp., Hsinchu, Taiwan

[21] Appl. No.: 430,191

[22] Filed: Apr. 27, 1995

[51] Int. Cl.⁶ .................................................. H01L 21/44
[52] U.S. Cl. .................... 437/187; 437/195; 437/235; 437/985
[58] Field of Search .................................. 437/187, 195, 437/235, 985

[56] References Cited

U.S. PATENT DOCUMENTS

| | | |
|---|---|---|
| 4,214,917 | 7/1980 | Clark et al. . |
| 4,305,760 | 12/1981 | Trudel . |
| 4,568,410 | 2/1986 | Thornquist ........................... 156/643.1 |
| 4,808,552 | 2/1989 | Andersen ................................ 437/187 |
| 5,115,296 | 5/1992 | Hsue et al. . |
| 5,183,781 | 2/1993 | Nakano .................................. 437/191 |
| 5,196,373 | 3/1993 | Beasom ................................. 437/203 |
| 5,229,326 | 7/1993 | Dennison et al. ..................... 437/195 |
| 5,316,978 | 5/1994 | Boyd et al. ............................ 437/203 |

FOREIGN PATENT DOCUMENTS 60-128651  7/1985  Japan .

OTHER PUBLICATIONS

S. Wolf et al "Silicon Processing for the VLSI Era vol. I" Lattice Press, Calif. (1986) pp. 182–185; 191–194.

*Primary Examiner*—George Fourson
*Assistant Examiner*—C. Everhart
*Attorney, Agent, or Firm*—George O. Saile

[57] ABSTRACT

A method for optimizing the connection between active device regions in silicon, to overlying metallization levels, has been developed. A polysilicon contact plug process, consuming less area then conventional contacts, has been created. The highlight of this process is the complete conversion of residual polysilicon, in all areas except in the contact hole, to thermal oxide. The thermal oxide is then selectively removed, resulting in a polysilicon contact plug structure.

20 Claims, 4 Drawing Sheets

OPTIMIZED CONTACT PLUG PROCESS

BACKGROUND OF THE INVENTION (1) Field of the Invention

The present invention relates to the fabrication methods used for semiconductor devices, and more specifically to an improved process allowing for contact between the active silicon device region and the overlying metal lines.

(2) Description of Prior Art

A major objective of the semiconductor industry is to achieve higher performing devices while still decreasing the cost of the semiconductor chip. The ability to place more chips on a wafer has significantly reduced the cost of semiconductor chips. This has been made possible by the industry being able to still increase device density, while maintaining, or increasing, the total number of devices on the smaller silicon chips. Micro-miniaturation, of specific device elements, has been a major factor in the trend to smaller chip sizes. The ability of the semiconductor community to decrease critical device dimensions has allowed the attainment of not only smaller chips, but also resulted in higher performing devices. The latter is accomplished by reducing the performance erroding resistances and capacitances, resulting with larger device areas.

The obvious factor in the reduction of critical device dimension, leading to improved device density, has been the advances in the photo lithographic discipline. More sophisticated exposure cameras, as well as more sensitive photoresist materials, have allowed sub-micron images in photoresist to be routinely achieved. In addition, similar advances in plasma etching disciplines have allowed the successful transfer of the sub-micron images, in photoresist, to an underlying material used for the construction of specific semiconductor chips, to occur. Other semiconductor disciplines, such as ion implantation, (I/I), as well as low pressure chemical vapor deposition, (LPCVD), have also been major, factors in meeting the micro-miniaturization objective. Thus advances in specific semiconductor process sectors have resulted in the increasing number of devices per chip, while still either maintaining, or reducing chip size.

In addition to reducing chip size via advances in semiconductor disciplines, further reductions have been experienced via development of specific processes, such as sidewall spacers and buried contact schemes. These processes have resulted in the reduction of device area, without the use of photoresist or plasma etching breakthroughs. Another process sequence used to conserve precious silicon area is the polysilicon contact plug concept. Communication between an underlying active device region, and an overlying interconnect metallury, is a critical part of the semiconductor fabrication process. Several vital aspects have to be satisfied to ensure device; density, performance and reliability. For example if to much area is consumed in achieving the connection, between the silicon and metal areas, device density will be decreased. Also if the spacing between contacts becomes to large, performance will suffer. Finally if compromises are made in the material chosen for the contact, reliability issues can arise. Therefore efforts have been directed to the use of polysilicon contacts, for this critical fabrication step. Bersom, etal, in U.S. Pat. No. 5,196,373, and Nakamo, etal., in U.S. Pat. No. 5,183,781, describe a polysilicon contact process, however without showing the exact details needed to successfully fabricate this structure. Also, Boyd, etal., in U.S. Pat. No. 5,316,978 show a polysilicon contact process using a complex and costly chemical mechanical polishing, (CMP), technique for polysilicon removal. The process described in this invention will detail a novel, non-costly technique, employed to create polysilicon contacts to active silicon device regions.

SUMMARY OF THE INVENTION

It is an object of this invention to provide an optimized method of fabricating a polysilicon contact plug to active silicon device elements.

It is another object of this invention to fill the contact hole, to the active silicon device region, with insitu doped polysilicon.

It is yet another object of this invention convert the unwanted polysilicon material to an oxide.

It is still yet another object of this invention to remove the oxide, resulting from the oxidation of the unwanted polysilicon, via wet etching, or reactive ion etching processes.

In accordance with this present invention a method is described for fabricating a polysilicon contact plug, to active device regions in a silicon substrate. A contact hole is opened to the active device regions in silicon, through a silicon nitride-silicon dioxide, dielectric composite. An insitu doped, polysilicon deposition is performed, using a deposited thickness that completely fills the contact hole. An oxidation is used to convert the unwanted polysilicon to an oxide, in regions in which the polysilicon overlayed the silicon nitride layer, ass well as in the region where the polysilicon extended beyond the top of the contact hole. A wet or dry etching process is then employed to selectively remove the oxidized polysilicon, resulting in a polysilicon filled contact hole to active device regions in the underlying silicon substrate.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of forming semiconductor devices, with the polysilicon contact plug process, will now be covered in detail. This polysilicon contact plug can be used as part of MOSFET devices that are currently being manufactured in industry, therefore only the specific areas unique to understanding this invention will be described in detail.

Figure 1:
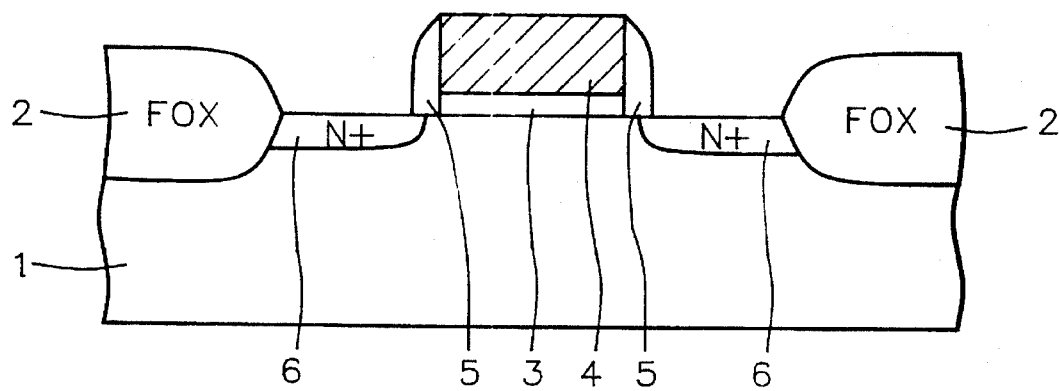
FIG. 1, which schematically, in cross-sectional representation, illustrates a specific metal oxide semiconductor field effect transistor, (MOSFET), device, prior to the start of the polysilicon contact plug fabrication sequence.

FIG. 1 shows a typical NFET (N-type Field Effect Transistor), to which the polysilicon contact plug process will be used with. A substrate, 1, composed of P type., single crystal silicon with a <100>orientation, is used. A thick field oxide region, 2, (FOX), is formed surrounding the region where the device is to be built. Briefly the method used to form the FOX region is to use a thin thermal oxide, and a silicon nitride layer, as an oxidation mask. The desired FOX insulator area is etched opened in the silicon nitride-silicon dioxide mask using conventional photolithographic techniques and dry etching processing. After removal of the masking photoresist, and a wet chemical clean, a field oxide is grown, typically to a thickness between about 4000 to 6000 Angstroms. After removal of the oxidation mask using a hot phosphoric acid solution, followed by a buffered hydrofluoric process to remove the thin silicon dioxide layer, a gate oxide 3, is grown at a temperature between about 850° to 950° C., to a thickness between about 70 to 250 Angstroms. Next a polysilicon layer is deposited using LPCVD processing, at a temperature between about 550° to 700° C., to a thickness between about 2000 to 4000 Angstroms. An ion implantation procedure, using phosphorous, at an energy between about 500 to 100 Kev., at a dose between about 1E13 to 5E14 atoms/cm2, is used to dope the underlying polysilicon layer. Standard photolithographic and reactive ion etching, (RIE), processing, using SF6 as an etchant, are next employed to create the polysilicon gate structure, shown in FIG. 1. Another LPCVD process, using tetraethylorthosilicate as a source material is used at a temperature between about 500° to 700° C., to deposit silicon oxide, to a thickness between about 2000 to 4000 Angstroms. Anisotropic, selective RIE procedures using CF4 and H2, are then used to create the oxide sidewall spacer, 5. The source and drain regions, 6, are next formed via ion implantation of arsenic, at an energy between about 50 to 100 Kev., at a dose between about 1E14 to 1E15 atoms/cm2.

Figure 2:
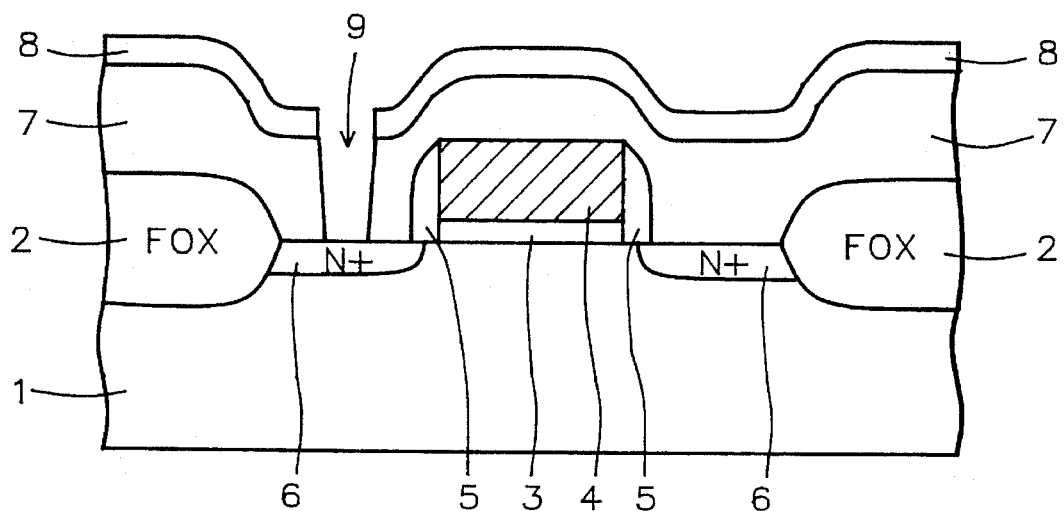
FIG. 2–6, which in cross-sectional style schematically illustrates the process sequence used to construct the polysilicon contact plug.

A silicon oxide layer, 7, is deposited using, LPCVD or APCVD, (atmospheric pressure chemical vapor deposition), at a temperature between about 400° to 800° C., to a thickness between about 6000 to 12000 Angstroms, followed by an LPCVD deposition of silicon nitride, 8, deposited at a temperature between 800° to 800° C., to a thickness between about 500 to 3000 Angstroms, using NH3 and SiH4 at a pressure between about 300 to 400 mTorr. Conventional photolithographic procedures are used to expose a region of the silicon nitride-silicon oxide dielectrics. A RIE procedure is then used to open the contact hole to the active device region in the substrate, using Cl2, for the silicon nitride, 8, while a CF4—CHF3—Ar chemistry is used to open the contact hole in oxide layer, 7. Photoresist removal and subsequent wet chemical cleanups result in contact hole, shown in FIG. 2.

Figure 3:
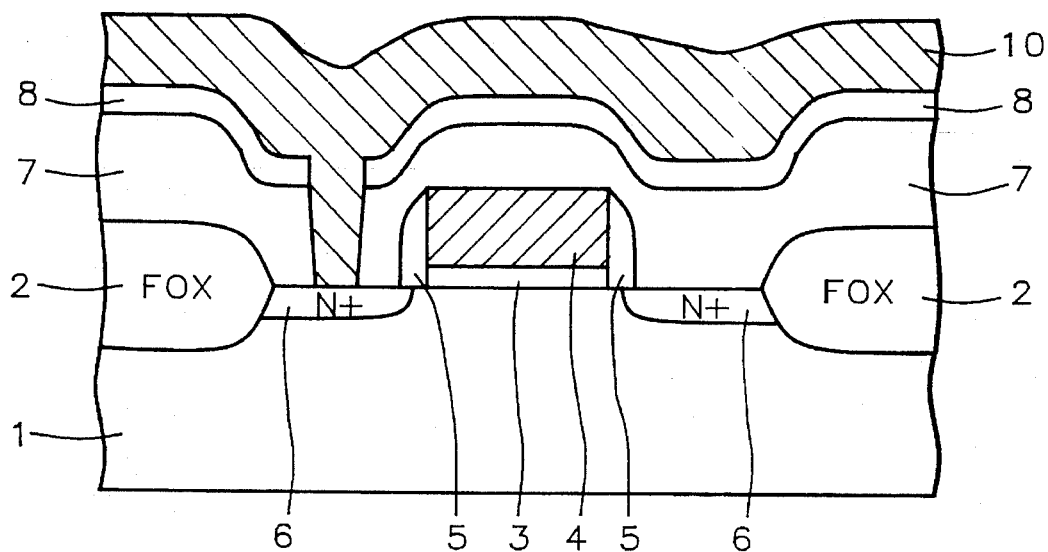

A desposition of insitu doped polysilicon, 10, is next performed, and shown in FIG. 3. This LPCVD process is carried out using between about 1200 to 1400 sccm of SiH4, and between about 100 to 300 sccm of PH3, at a temperature between about 550° to 600° C., to a thickness between about 1000 to 4000 Angstroms. It is critical to deposit a thick enough layer of polysilicon to completely fill contact hole, 9. It is also vital to insitu dope the polysilicon layer, 10, to a level sufficient to act as a conductive link between the underlying device region 6, and subsequent metallizations. Therefore the polysilicon grown using the SiH4—PH3 process results in a polysilicon sheet resistance between about 10 to 110 ohms/sq. It should also be noted that the wet cleanup, used prior to deposition of the insitu polysilicon layer, 10, has to effectively remove all native oxide from the surface of region 6, to insure low interface, or contact resistance between the layers. Therefore the wet chemical cleanup is performed using a solution of 10 parts ammonium fluoride, to 1 part hydrofluoric acid.

Figure 4:
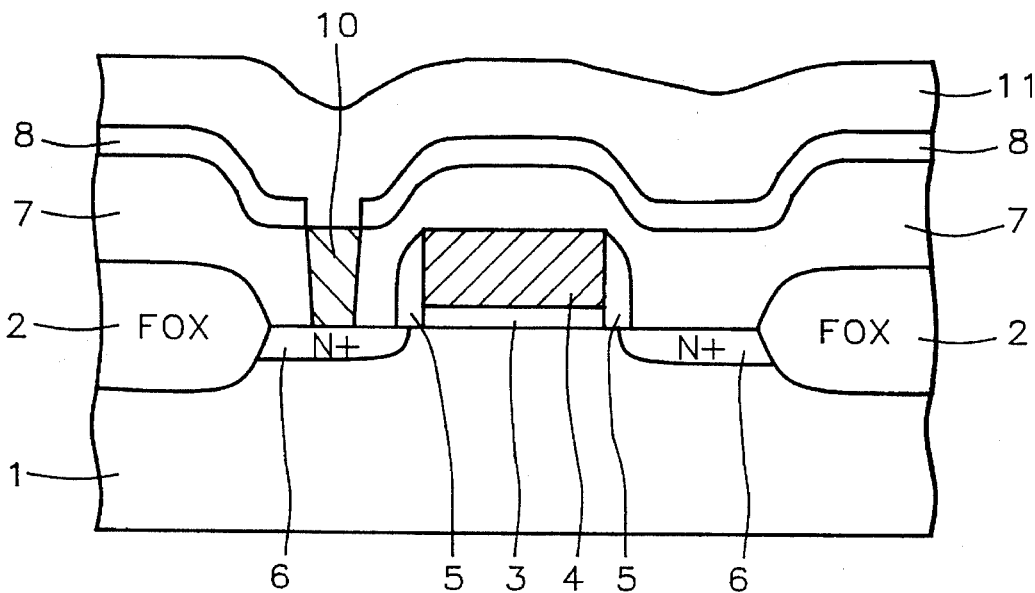

The next process sequence is another critical step, used to convert a portion of the polysilicon layer to silicon dioxide, via thermal oxidation. The oxidation is performed such that all the polysilicon, lying on silicon nitride layer, 8, will be converted to silicon dioxide. Therefore to insure against residual polysilicon at the completion of this step, the oxidation is performed for a period of time needed to convert the total thickness of polysilicon lying on silicon nitride to silicon dioxide, plus an additional period c,f time needed to assure complete removal of all residual polysilicon from the silicon nitride layer. This is accomplished by an additional oxidation, consuming polysilicon in the contact hole, to a level equal in thickness to the thickness of the silicon nitride layer, 8. The critical oxidation is performed in an oxygen-steam ambient, at a temperature between about 700° to 900° C., for a period of time needed to convert between about 1000 to, 2000 Angstroms of polysilicon, to between about 2000 to 4000 Angstroms of silicon dioxide. The silicon dioxide layer, 11, is shown schematically in FIG. 4.

Figure 5:
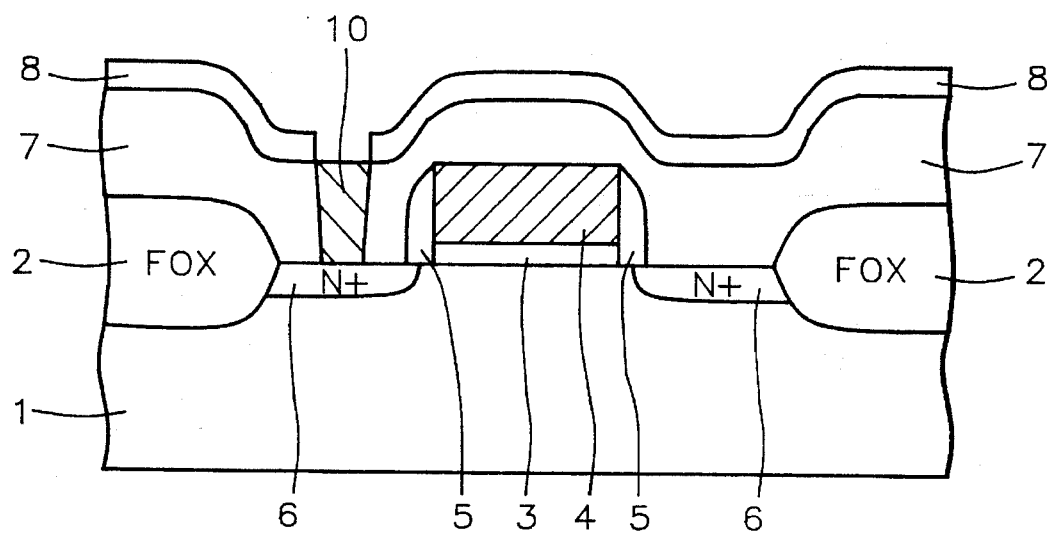
Figure 6:
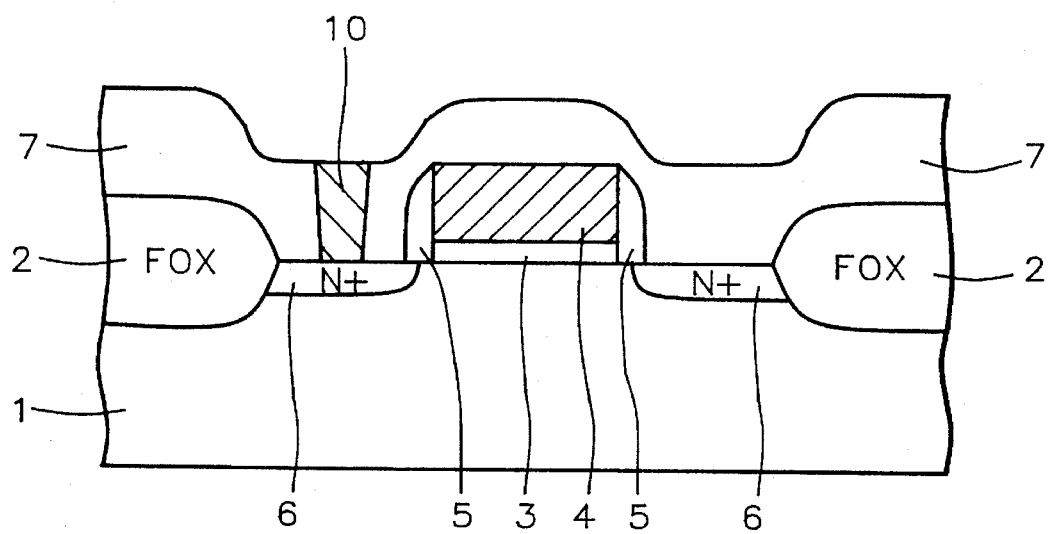

A selective etch step is next used to remove the silicon dioxide layer, 11, from the silicon nitride layer, 8, as well as from the polysilicon in the contact hole. This can be accomplished again via a 10:1, buffered hydrofluoric acid solution, at a temperature between about 20° to 25° C. The time of exposure to the buffered hydrofluoric acid solution is not critical, since the underlying silicon nitride, and polysilicon are not soluble in this wet etchant. This is shown in FIG. 5. Finally the silicon nitride layer, 8, is removed, again via use of a hot phosphoric acid solution. The resulting polysilicon contact plug, 10, and the resulting smooth topography is schematically illustrated in FIG. 6.

Figure 7:
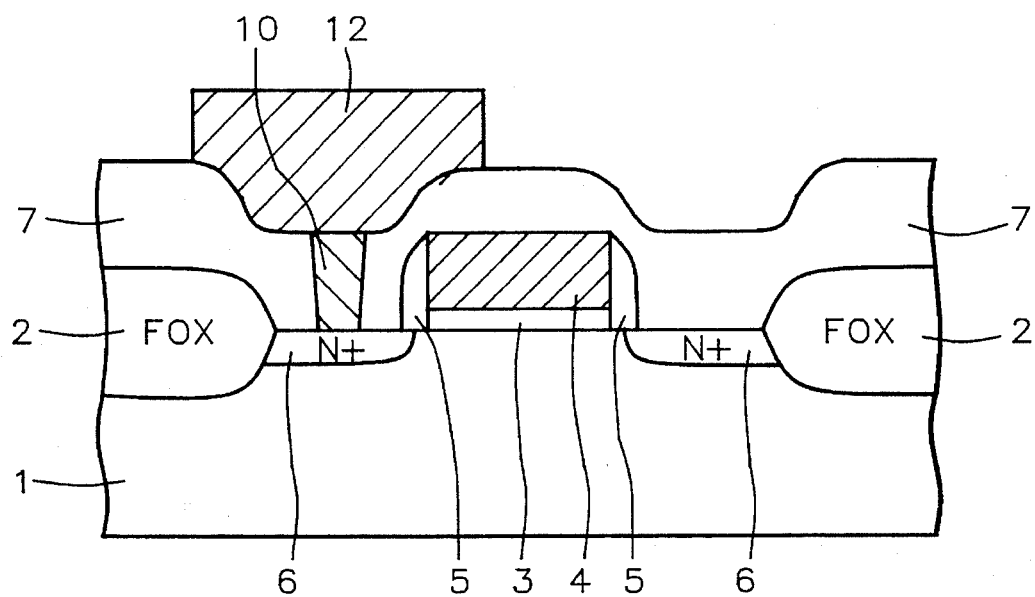
FIG. 7, schematically showing a metallized MOSFET device, fabricated via use of the polysilicon contact plug process.

FIG 7 illustrates an interconnect metallization, used in curt junction with the polysilicon contact plug structure. A metallization, in the form of Al—Cu, is deposited to a thickness between about 6000 to 12000 Angstroms. Standard photolithographic and RIE processing, using a Cl2—BCl3 etchant, are used to form metal structure, 12, which allows contact to the underlying N+ region, 6, through the polysilicon contact plug, 10.

This process, a optimized polysilicon contact, although shown as part of a NFET, MOS device, can be used as well in PFET devices. In addition complimentary, (CMOS), as well as BiCMOS devices can also be fabricated via use of this invention.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a MOSFET device on a semiconductor substrate, using a conductive plug to provide electrical contact between an active device region in the substrate, and the interconnect metallization, comprising the steps of:

providing said active device element in said semiconductor substrate;

depositing a first dielectric layer on said semiconductor substrate, that includes said active device element;

depositing a second dielectric layer on said first dielectric layer, to form composite dielectric layer;

photolithographic processing to open a region in photoresist, exposing said composite dielectric layer, directly overlying said active device element;

anisotropic removal of said composite dielectric layer, in said exposed region in photoresist, to create a contact hole to said active device region;

cleaning surface of said active device region, in said contact hole opening;

depositing an insitu doped layer of polysilicon on said active device region, in said contact hole, and on said second dielectric layer;

oxidation of said insitu doped polysilicon layer to completely convert said insitu doped polysilicon, on said second dielectric layer, to silicon oxide, while converting only top portion of said insitu doped polysilicon, in said contact hole, to silicon oxide;

removal of said silicon oxide from surface of said second dielectric layer, and from surface of said insitu doped polysilicon, in said contact hole; and removal of said second dielectric layer from surface of said first dielectric layer.

2. The method of claim 1, wherein said active device region in said semiconductor substrate, is an N type doped region.

3. The method of claim 1, wherein said first dielectric layer is silicon oxide, deposited using LPCVD processing, at a temperature between about 400° to 800° C., to a thickness between about 6000 to 12000 Angstroms.

4. The method of claim 1, wherein said second dielectric layer is silicon nitride, deposited using LPCVD processing, at a temperature between about 600° to 800° C., to a thickness between about 500 to 3000 Angstroms.

5. The method of claim 1, wherein said contact hole is created via anisotropic RIE removal of said composite dielectric, using C18, for said second dielectric layer, and a CF4—CHF3—Argon chemistry, for said first dielectric layer.

6. The method of claim 1, wherein surface of said active device region, in said contact hole, is cleaned using a solution of ammonium fluoride and hydrofluoric acid, at a temperature between about 20° to 25° C., for a time between about 10 to 60 sec.

7. The method of claim 1, wherein said insitu doped polysilicon layer is deposited using LPCVD processing, at a temperature between about 500° to 700° C., to a thickness between about 1000 to 4000 Angstroms, using a flow between about 1200 to 1400 sccm of SiH4, and a flow between about 100 to 300 sccm of PH3.

8. The method of claim 1, wherein the sheet resistance of said insitu doped polysilicon layer is between about 10 to 110 ohms/square.

9. The method of claim 1, wherein oxidation of said insitu doped polysilicon layer is performed at a temperature between about 700° to 900° C., for a period of time needed to convert between about 1000 to 3000 Angstroms of said insitu doped polysilicon to silicon oxide.

10. The method of claim 1, wherein said silicon oxide is removed using a solution of ammonium fluoride and hydrofluoric acid, at a temperature between about 20° to 25° C.

11. A method for fabricating a MOSFET device on a semiconductor substrate, using a polysilicon plug to provide electrical contact between a source and drain device region in a substrate, and a interconnect metallization, comprising the steps of:

providing said source and drain region in said semiconductor substrate;

depositing a silicon oxide layer on said semiconductor substrate, that includes said source and drain region;

depositing a silicon nitride layer on said silicon oxide layer, to form composite dielectric layer;

photolithographic processing to open a region in photoresist, exposing said composite dielectric layer, directly overlying said source and drain region;

anisotropic removal of said composite dielectric layer, in said exposed region in photoresist, to create a contact hole to said source and drain region;

cleaning surface of said source and drain region, in said contact hole;

depositing an insitu doped polysilicon layer on said source and drain region, in said contact hole, and on said silicon nitride layer;

oxidation of said insitu doped polysilicon layer to completely convert said insitu doped polysilicon, on said silicon nitride layer, to thermal silicon oxide, while converting only top portion of said insitu doped polysilicon, in said contact hole, to thermal silicon oxide;

removal of said thermal silicon oxide from surface of said silicon nitride layer, and from said unoxidized insitu doped polysilicon, in said contact hole; and removal of said silicon nitride layer from surface of said silicon oxide layer.

12. The method of claim 11, wherein said source and drain region in said semiconductor substrate, is an N type doped region.

13. The method of claim 11, wherein said silicon oxide layer is grown using LPCVD processing, at a temperature between about 400° to 800°C., to a thickness between about 6000 to 12000 Angstroms.

14. The method of claim 11, wherein said silicon nitride layer is grown using LPCVD processing, at a temperature between about 600 to 800° C., to a thickness between about 500 to 3000 Angstroms.

15. The method of claim 11, wherein said contact hole, to said source and drain region, is created via RIE processing using C12, for said silicon nitride layer, and a CF4—CHF3—Argon chemistry, for said silicon oxide layer.

16. The method of claim 11, wherein surface of said source and drain region, in said contact hole, is cleaned using a solution of ammonium fluoride and hydrofluoric acid, at a temperature between about 20° to 25° C., for a time between about 10 to 60 sec.

17. The method of claim 11, wherein said insitu doped polysilicon layer, used to create the polysilicon contact plug, is deposited using LPCVD, at a temperature between about 500° to 700° C., to a thickness between about 1000 to 4000 Angstroms, using a SiH4 flow between about 1200 to 1400 sccm, and an PH3 below between about 100 to 300sccm.

18. The method of claim 11, wherein the sheet resistance of said insitu doped polysilicon layer, used to create the polysilicon contact plug, is between about 10 to 110 ohms/square.

19. The method of claim 11, wherein oxidation of said insitu doped polysilicon is performed at a temperature between about 700° to 900° C., for a period of time needed to convert between about 1000 to 3000 Angstroms of said insitu doped polysilicon to thermal silicon oxide.

20. The method of claim 12, wherein said thermal silicon oxide is removed using a solution of ammonium fluoride and hydrofluoric acid, at a temperature between about 20° to 25° C.

* * * * *